United States Patent [19]
Shiozawa

[11] Patent Number: 5,459,547
[45] Date of Patent: Oct. 17, 1995

[54] ILLUMINATION DEVICE

[75] Inventor: Takahisa Shiozawa, Kawasaki, Japan

[73] Assignee: Canon Kabushiki Kaisha, Tokyo, Japan

[21] Appl. No.: 81,194

[22] Filed: Jun. 25, 1993

[30] Foreign Application Priority Data

Jun. 25, 1992 [JP] Japan .................................. 4-193123

[51] Int. Cl.⁶ .......................... G03B 27/54; G03B 27/42
[52] U.S. Cl. ............................ 355/067; 355/53; 362/268
[58] Field of Search ............................. 362/268; 355/53, 355/67, 70

[56] References Cited

U.S. PATENT DOCUMENTS

| | | |
|---|---|---|
| 4,497,013 | 1/1985 | Ohta . |
| 4,497,015 | 1/1985 | Konno et al. . |
| 4,498,742 | 2/1985 | Uehara . |
| 4,974,919 | 12/1990 | Muraki et al. . |
| 4,988,188 | 1/1991 | Ohta . |
| 5,016,149 | 5/1991 | Tanaka et al. . |
| 5,048,926 | 9/1991 | Tanimoto . |
| 5,153,773 | 10/1992 | Muraki et al. . |

FOREIGN PATENT DOCUMENTS

| | | |
|---|---|---|
| 0486316 | 5/1992 | European Pat. Off. . |
| 54-111832 | 9/1979 | Japan . |

OTHER PUBLICATIONS

Fukuda, et al., "Nikkei Microdevices", Jul. 1990, pp. 108 through 114.
Noguchi et al., "Subhalf Micron Lithography System with Phase–Shifting Effect", SPIE vol. 1674 Optical/Laser Microlithography V (1992), pp. 92–104.

*Primary Examiner*—Richard A. Wintercorn
*Attorney, Agent, or Firm*—Fitzpatrick, Cella, Harper & Scinto

[57] ABSTRACT

An illumination device includes first and second optical integrators disposed along an optical axis and each having lens elements arrayed in a direction intersecting the optical axis; a condensing optical system for collecting light passed through the first and second optical integrators, to form a secondary light source; and a mechanism for relatively shifting the second optical integrator relative to the first optical integrator, in a direction intersecting the optical axis.

50 Claims, 9 Drawing Sheets

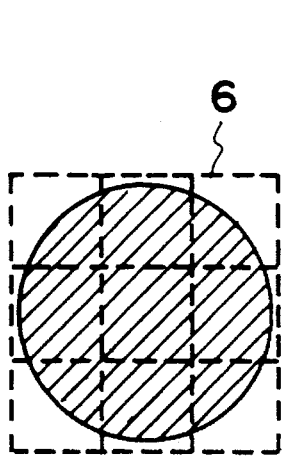 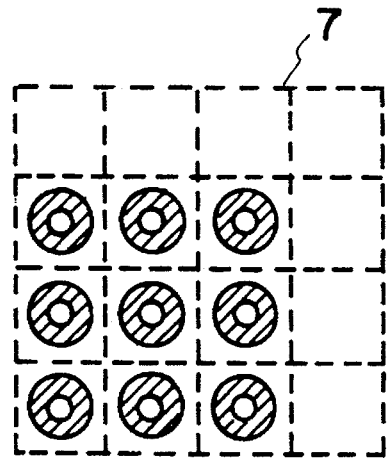 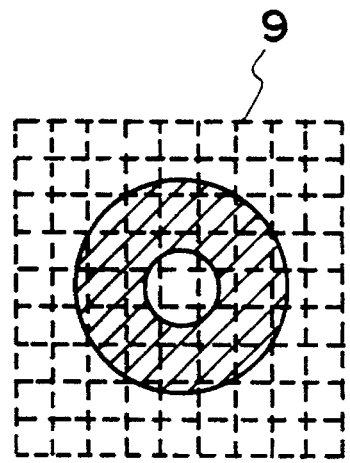
FIG. 10A  FIG. 10B  FIG. 10C
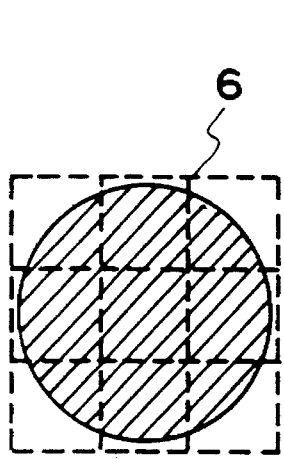 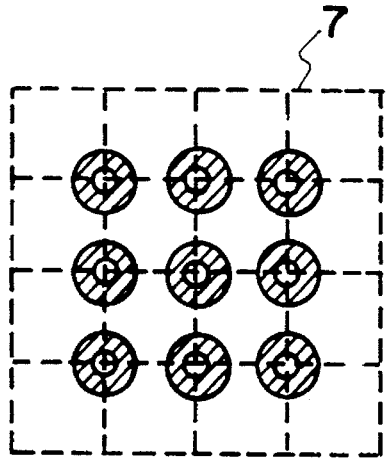 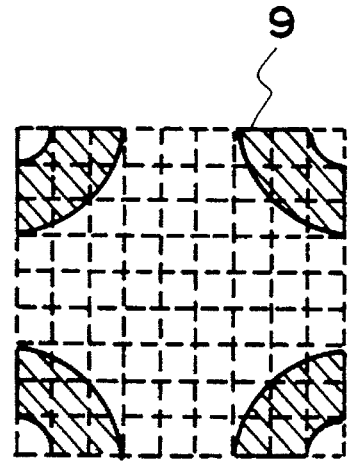
FIG. 11A  FIG. 11B  FIG. 11C

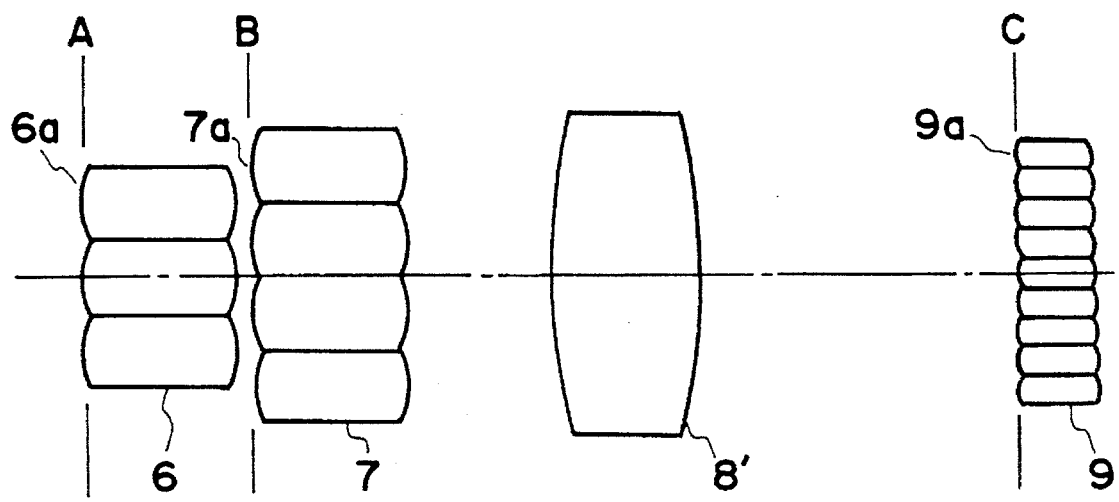
F I G. 12

ILLUMINATION DEVICE

FIELD OF THE INVENTION AND RELATED ART

This invention relates to an illumination device and, more particularly, an illumination device suitably usable in an exposure apparatus for the manufacture of microdevices such as semiconductor chips, liquid crystal panels, CCDs or magnetic heads.

Semiconductor device manufacturing technology has recently advanced significantly and, along with this, the fine processing technique has improved considerably. Particularly, the optical processing technique has pressed the fine processing into a submicron region, with manufacture of a device of 1-megabil DRAM. In many conventionally adopted methods, for enhanced resolution, the numerical aperture (NA) of an optical system is enlarged while keeping the exposure wavelength fixed. Recently, however, it has been proposed and practiced to use an exposure wavelength of i-line in place of g-line, in an attempt to improve the resolution in accordance with an exposure method using an ultra-high pressure Hg lamp.

Along the advancement of using g-line or i-line as the exposure wavelength, the resist process itself has been advanced. Such improvements in the optical system and in the process together have accomplished rapid advancement of optical lithography.

Generally it is known that the depth of focus of a stepper is in inverse proportion to the square of the NA. It means that enhancing the resolution into a submicron order necessarily results in a problem of decreased depth of focus.

In consideration of this problem, many proposals have been made to use shorter wavelengths, as represented by an excimer laser, for enhancement of the resolution. It is known that the effect of using a shorter wavelength is in inverse proportion to the wavelength, and the shorter the wavelength is, the deeper the depth of focus is.

On the other hand, independently of using light of shorter wavelength, many proposals have been made to use a phase shift mask (phase shift method), in an attempt to improve the resolution. According to this method, a mask of conventional type is locally provided with a thin film that imparts, to light to be transmitted, a telecentric phase shift of 80 deg. relative to the light incident on the remaining portion. An example has been proposed by Levenson of the IBM corporation. Here, if the wavelength is denoted by λ, the parameter is denoted by $k_1$ and the numerical aperture is denoted by NA, then the resolution RP can be given by:

$$RP=k_1 \lambda/NA$$

It is known that the parameter $k_1$, whose practical range is usually taken as 0.7–0.8, can be improved to about 0.35 with this phase shift method.

There are many varieties of such phase shift methods, as referred to in a paper by Fukuda et al ("Nikkei Microdevices", July 1990, from page 108).

An enhanced-resolution exposure method and apparatus is discussed in "Optical/Laser Microlithography V", SPIE Vol. 1674, 1992, pages 91–104. In this system, for high-resolution projection, an illumination light (effective light source) is divided into four sections so as to provide four off-axis illumination lights.

SUMMARY OF THE INVENTION

It is an object of the present invention to provide an improved illumination device. In one form of the invention, the illumination device produces different illumination lights.

It is another object of the present invention to provide an exposure apparatus that uses such an illumination device.

It is a further object of the present invention to provide a microdevice manufacturing method that uses such an illumination device.

In accordance with an aspect of the present invention, there is provided an illumination device, comprising: first and second optical integrators disposed along an optical axis and each having lens elements arrayed in a direction intersecting the optical axis; a condensing optical system for collecting light passed through said first and second optical integrators, to form a secondary light source; and means for relatively shifting said second optical integrator relative to said first optical integrator, in a direction intersecting the optical axis.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 10A–10C are schematic views for explaining light intensity distributions on the light entrance surfaces of the optical integrators of a second embodiment of the present invention.

FIGS. 11A–11C are schematic views for further explaining light intensity distributions on the light entrance surfaces of the optical integrators of a second embodiment of the present invention.

FIG. 12 is a schematic view of a portion of a third embodiment of the present invention.

DESCRIPTION OF THE PREFERRED EMBODIMENTS

Figure 1:
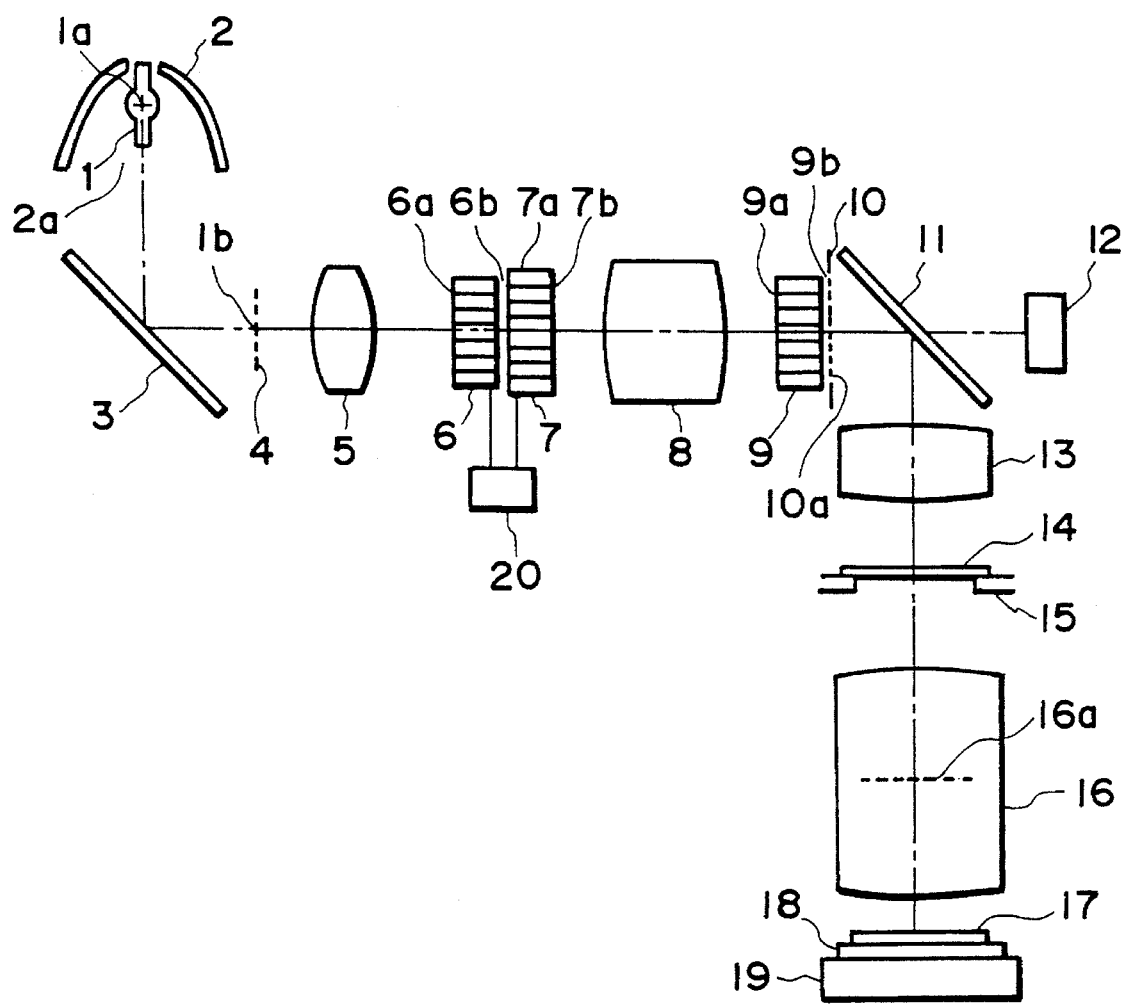
FIG. 1 is a schematic view of a main portion of a first embodiment of the present invention.
Figure 2:
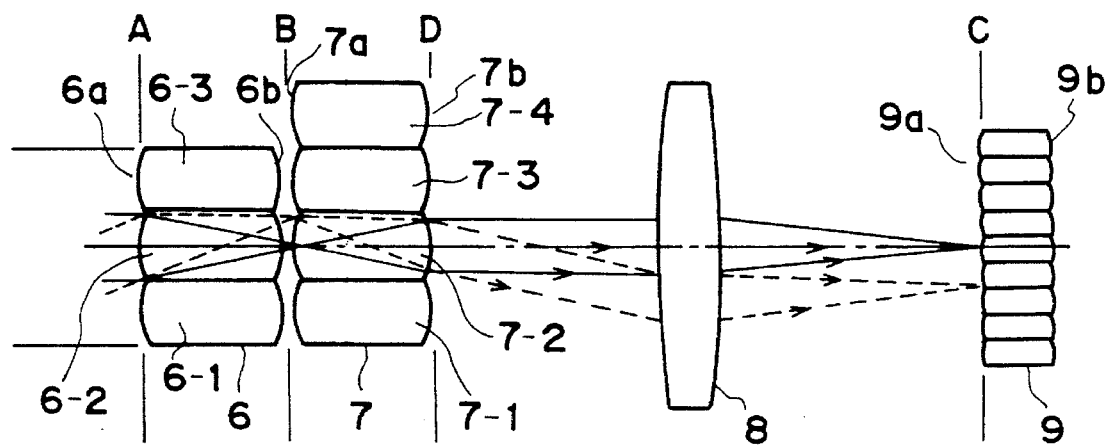
FIG. 2 is an enlarged view of a portion of FIG. 1.

Referring to FIGS. 1 and 2, a first embodiment of the present invention will be explained. Denoted at 2 is an elliptical mirror, and denoted at 1 is a light emitting tube (light source) which includes a high-luminance light emitting portion 1a for emitting ultraviolet rays and deep-ultraviolet rays, for example. The light emitting portion 1a is disposed adjacent to the first focal point of the elliptical mirror 2. Denoted at 3 is a cold mirror which is provided with a multilayered film effective to transmit most of infrared rays but to reflect most of ultraviolet rays. The elliptical mirror 2 cooperates with the cold mirror 3 to form an image (light source image) 1b of the light emitting portion 1a, in the neighborhood of the second focal point 4.

Figure 8:
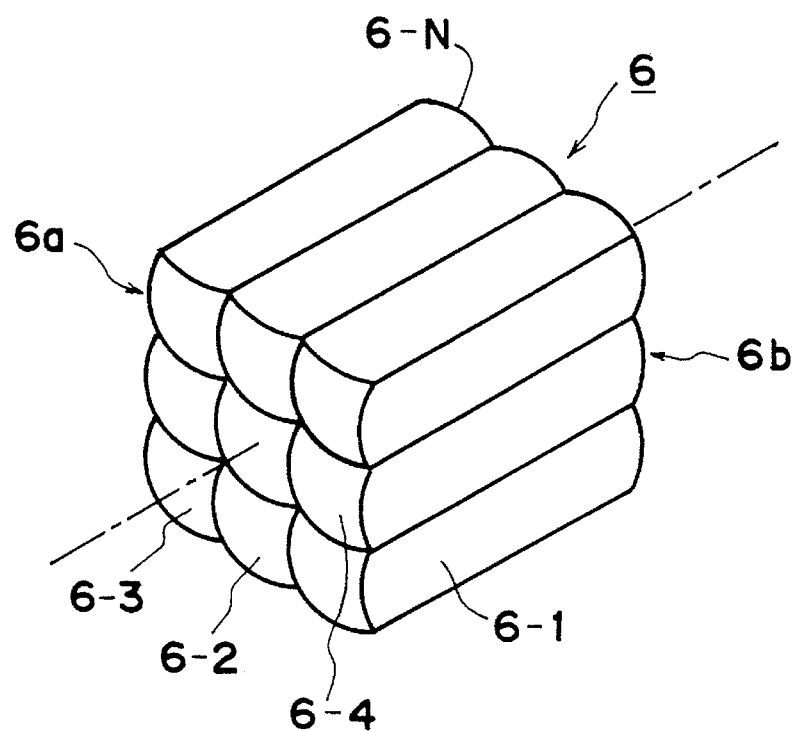
FIG. 8 is an enlarged view of a portion of FIG. 1.

Denoted at 5 is an optical system (lens system) for projecting light from the light emitting portion image 1b upon the light entrance surface 6a of a first optical integrator 6. The optical system 5 serves to place an opening 2a of the elliptical mirror 2 and the light entrance surface 6a of the first optical integrator, in an optically conjugate relation. As shown in FIG. 8, the first optical integrator 6 comprises small lenses 6i (i=1 to N) arrayed two-dimensionally at a predetermined pitch P. As shown in FIG. 2, it serves to form a secondary light source at a predetermined position (adjacent to the light entrance surface 7a of a second integrator 7, to be described) in the neighborhood of the light exit surface 6b.

Denoted at 7 is the second optical integrator which comprises small lenses 7l (i=1 to M (M>N)) arrayed two-dimensionally at the same pitch P of the small lenses of the first optical integrator 6. The second optical integrator 7 serves to project the light coming from the secondary light source formed on its light entrance surface 7a, from its light exit surface 7b in the form of substantially parallel light.

Denoted at 20 is a changing means for displacing at least one of the first and second optical integrators, to change the positional relationship between the small lenses of these optical integrators.

Denoted at 8 is a first condensing lens for collecting the light from the second optical integrator 7 and for projecting it on a third optical integrator 9. The secondary light source formed on the light entrance surface 7a of the second optical integrator 7 by the first optical integrator 1, is imaged on the light entrance surface 9a of the third optical integrator 9 by means of the second optical integrator 7 and the first condensing lens 8. On the light exit surface 9b of the third optical integrator 9, a secondary light source (image) having a light intensity distribution corresponding to that defined on the light entrance surface 9a of the third optical integrator 9 is formed.

In this embodiment, the elements 7 and 8 are so set that the light entrance surface 7a of the second optical integrator 7 and the light entrance surface 9a of the third optical integrator 9 are placed substantially in a conjugate relation.

Also, in this embodiment, the elements 6, 7, 8, and 9 are so set that the light entrance surface 6a of the first optical integrator 6, the light exit surface 7b of the second optical integrator 7 and the light exit surface 9b of the third optical integrator 9 are placed substantially in a conjugate relation.

Denoted at 10 is a stop member having openings, which is disposed adjacent to the light exit surface 9b of the third optical integrator 9. The stop member 10 is so arranged that its opening shape on the light path can be changed. This assures the changeability of the shape of the secondary light source 10a to be formed at the position of the stop member 10.

Denoted at 11 is a half mirror. Most of the light from the stop member 10 is reflected by this half mirror 11. The remaining light passes through the half mirror 11 and is received by a photodetector 12. Denoted at 13 is a second condensing lens for collecting the light reflected by the half mirror 11, to illuminate a circuit pattern of a reticle 14 surface (surface to be illuminated) placed on a reticle stage 15.

Denoted at 16 is a projection optical system for projecting, in a reduced scale, the circuit pattern on the reticle 14 surface onto the surface of a wafer 17 placed on a wafer chuck 18. Here, the secondary light source 10a adjacent to the light exit surface 9b of the optical integrator 9 is imaged by the second condensing lens 13 on the pupil 16a of the projection optical system 16. Denoted at 19 is a wafer stage on which the chuck 18 is mounted.

Figure 3:
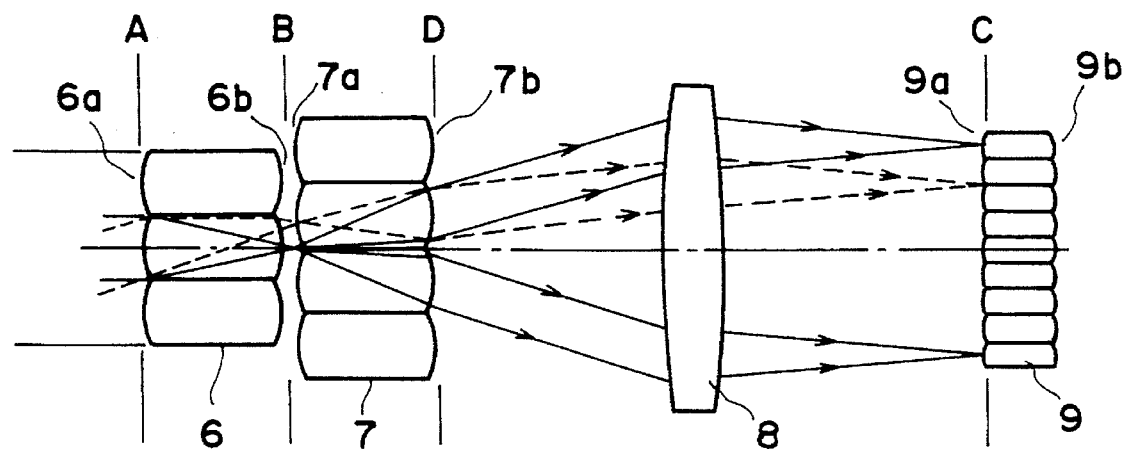
FIG. 3 is an enlarged view of a portion of FIG. 1.

In this embodiment, in accordance with the orientation and linewidth, for example, of the circuit pattern of the reticle 14, one of the state of FIG. 2 (normal illumination) and the state of FIG. 3 (off-axis illumination) wherein the second optical integrator 7 is displaced perpendicularly to the optical axis, is selected. The selection is made by using the changing means 20. As required, the positions of the optical system 5 and the first condensing lens and/or the aperture shape of the stop member 10 may be changed. This is done to change the light intensity distribution of the secondary light source image to be formed on the pupil plane 16a of the projection optical system 16.

The photodetector 12 comprises a sensor array (e.g. a CCD array). It receives the light transmitted through the half mirror 11, and it monitors the quantity of light impinging on the reticle 14 as well as the shape (light intensity distribution) of the secondary light source 10a formed adjacent to the light exit surface 9b of the third optical integrator 9.

Now, the features of the optical arrangement from the first optical integrator 6 up to the third optical integrator 9 of this embodiment will be explained.

As shown in FIG. 2, the focal point positions of the small lenses 6i at the exit (rear) side of the first optical integrator 6 and the focal point positions of the small lenses 7i at the entrance (front) side of the second optical integrator 7 are approximately coinciding along the plane B. The plane B approximately coincides with the light entrance surface 7a of the second optical integrator 7. Plane A corresponds to the light entrance surface 6a of the first optical integrator, and plane C corresponds to the light entrance surface 9a of the third optical integrator 9. The light entrance surface 6a of the first optical integrator 6 and the focal point positions of the small lenses 6i at the entrance side of the integrator 6 are approximately coinciding, while the light exit surface 7b of the second optical integrator 7 and the focal point position D of the small lenses 7i at the exit side of the integrator 7 are approximately coinciding.

Now, it is assumed that the small lens 6i has a focal length f1, the small lens 7i has a focal length f2 and the first condensing lens 8 has a focal length F1.

Figure 9:
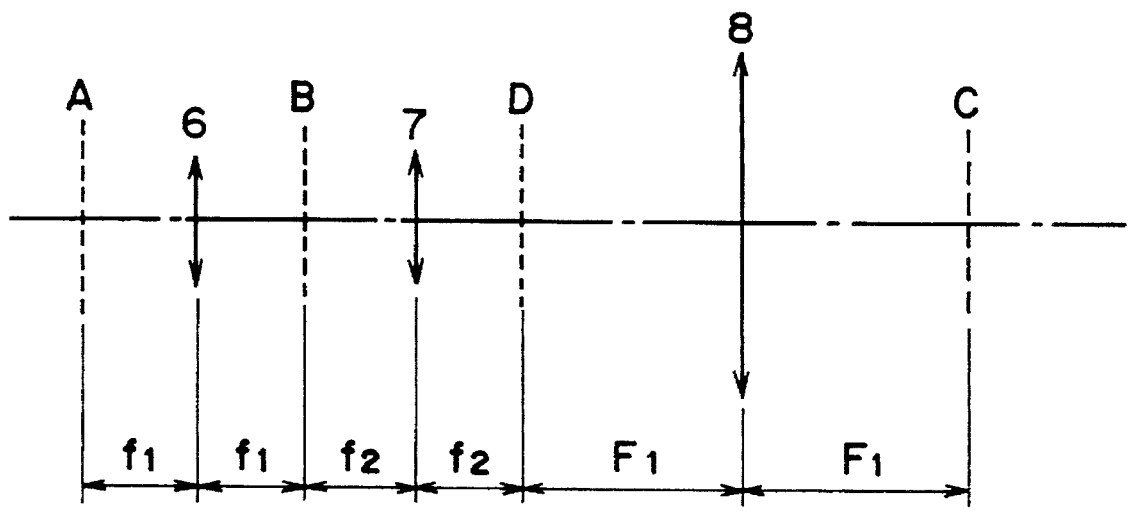
FIG. 9 is a schematic view for explaining the paraxial refractive power arrangement of the elements of FIG. 2.

FIG. 9 schematically shows the paraxial arrangement of the optical system, from the light entrance surface 6a (plane A) of the first optical integrator 6 to the light entrance surface (plane C) of the third optical integrator 9.

In this embodiment, the relation $f1 \geq f2$ is satisfied so as to assure that the light incident on the first optical integrator 6 is projected on the second optical integrator 7 and exits therefrom, without being eclipsed by the side face of the small lens 6i.

In this embodiment, by using the changing means 20, the second optical integrator 7 is displaced perpendicularly to the optical axis (translationally deviated) to change the light intensity distribution (secondary light source) on the light entrance surface 9a of the third optical integrator 9, to thereby change the light intensity distribution of the secondary light source image formed in the neighborhood of the pupil plane 16a of the projection optical system 16. Here, the light intensity distribution on the light entrance surface 9a of the integrator 9 is changed, from a substantially uniform distribution to a distribution wherein the intensity is higher in the off-axis area than in the on-axis area. Also, the light intensity distribution of the secondary light source image adjacent to the pupil plane 16a is changed, from a substantially uniform distribution to a distribution wherein the intensity is higher in the off-axis area than in the on-axis area. The optical action in such an intensity distribution change will now be explained.

In this embodiment, by means of the optical system 5, an image of the opening 2a of the elliptical mirror 2 is formed on the light entrance surface 6a of the first optical integrator 6. Thus, the light intensity distribution on the light entrance surface 6a of the integrator 6 has a higher intensity area as depicted by hatching in FIG. 4A. The manner of illustration applies to the remaining drawings. The grid as depicted by broken lines in FIG. 4A represents the array of the small lenses 6i.

Each small lens of this embodiment has a square sectional shape. When as shown in FIG. 2 the small lenses of the first optical integrator 6 and the small lenses of the second optical integrator 6 are placed in a coaxial relation and do not have eccentricity (i.e. the state of normal illumination), the light source images are formed by the first optical integrator 6 on the light entrance surface 7a of the second optical integrator 7 such as shown in FIG. 4B. The grid depicted by broken lines in FIG. 4B represents the array of the small lenses 7i of the second optical integrator 7.

Figures 4A, 4B, 4C:
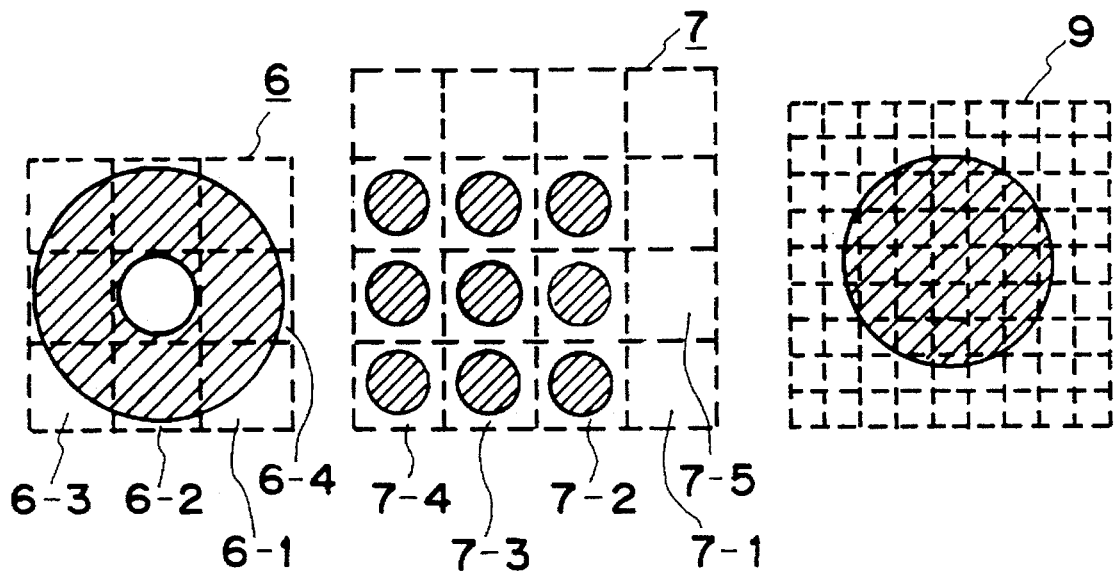
FIGS. 4A–4C are schematic view for explaining light intensity distributions on the light entrance surfaces of the optical integrators of FIG. 2.

By means of the small lenses 7i and the first condensing lens 8, the light source images formed on the light entrance surface 7a of the integrator 7 are then superposed one upon another, on the light entrance surface 9a of the third optical integrator 9 such as shown in FIG. 4C. The light intensity distribution of FIG. 4C thus defined is close to a Gaussian distribution. The grid as depicted by broken lines in FIG. 4C represents the array of the small lenses 9i (i–1 to N) of the third integrator 9.

The light intensity distribution defined on the light entrance surface 9a of the integrator 9 determines the light intensity distribution of the effective light source (secondary light source) to be formed on the pupil plane 16a of the projection optical system 16. As a result, the effective light source formed on the pupil plane 16a of the projection optical system has a light intensity distribution close to a Gaussian distribution. The manner of illumination using such a light intensity distribution (i.e. normal illumination) is to be used in cases where the circuit pattern of the reticle 14 has a relatively large linewidth.

If the linewidth of the circuit pattern of the reticle 14 is relatively small and a high resolution is required, by using the changing means 20 the second optical integrator 7 is shifted relative to the first optical integrator 6, as shown in FIG. 3, in a direction perpendicular to the optical axis and by an amount corresponding to a half of the pitch of the small lenses 7i (i.e. by a half pitch in a direction of an orthogonal array of the small lenses). It is to be noted that as shown in FIG. 5A the light intensity distribution on the light entrance surface 6a of the integrator 6 is the same as that of FIG. 4A.

Figures 5A, 5B, 5C:
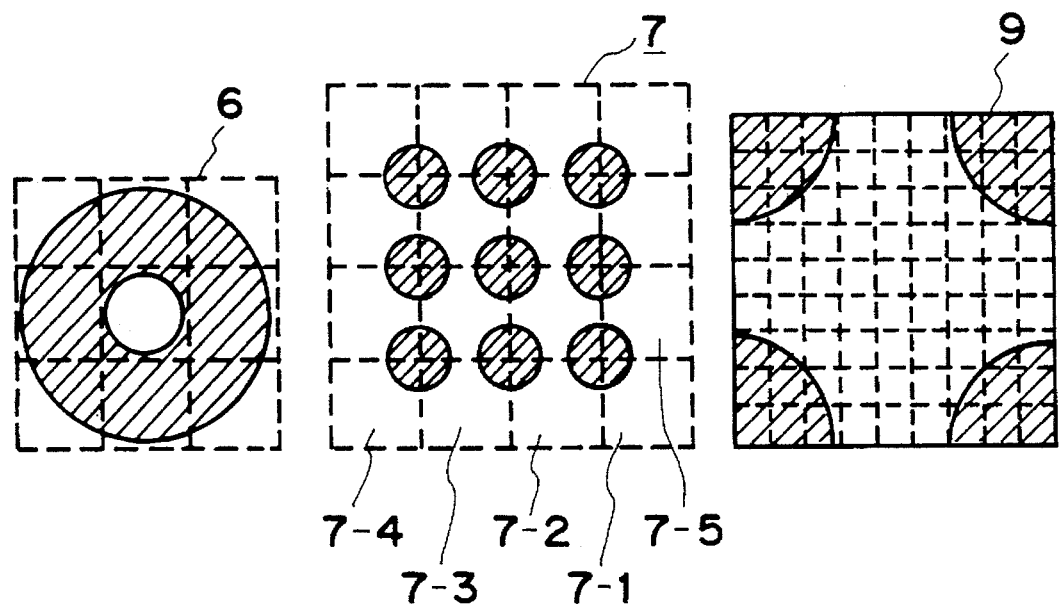
FIGS. 5A–5C are schematic views for explaining light intensity distributions on the light entrance surfaces of the optical integrators of FIG. 3.

As shown in FIG. 5B, by means of the optical integrator 6, light source images are formed on the light entrance surface 7a (plane B) of the second optical integrator 7. As seen from FIG. 5B, on the light entrance surface 7a of the integrator 7 each light source image is formed while partially covering four small lenses. As a result, each light source image is divided into four. By means of the first condensing lens 8, the thus divided light source images are superposed on the light entrance surface 9a (plane C) of the third optical integrator 9 such as shown in FIG. 5C.

In this embodiment, a secondary light source image corresponding to the light intensity distribution with quadruplex peaks is formed on the pupil plane 16a of the projection optical system 16, and high-resolution illumination is made in this manner. In accordance with this illumination method, the circuit pattern of the reticle 14 is projected and transferred by the projection optical system 16 onto the wafer 17 surface. Through subsequent various processes such as a developing process, semiconductor devices are produced.

In this embodiment, in the high-resolution illumination state shown in FIG. 3, by using the changing means 20 the distance between the first and second optical integrators 6 and 7 along the optical axis may also be changed to adjust the intensity distribution of the secondary light source or the effective light source.

Figure 6:
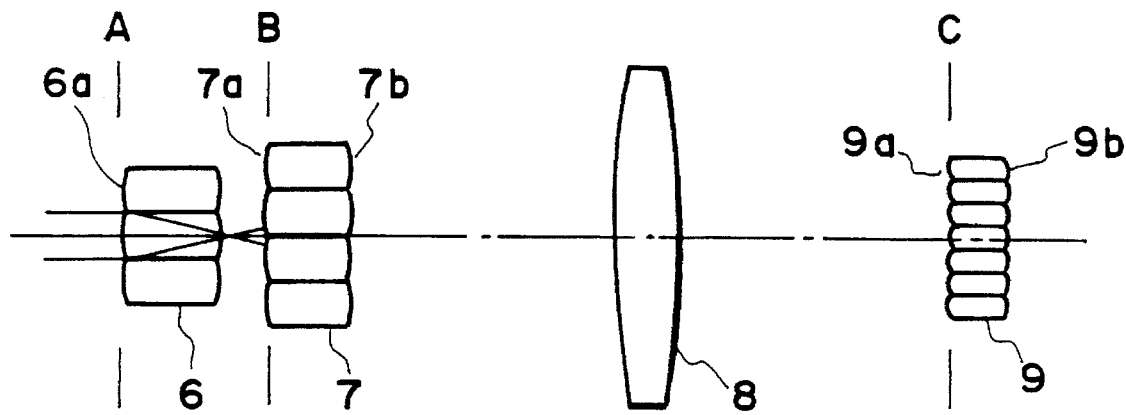
FIG. 6 is a schematic view of a modified form of the FIG. 3 example.
Figure 7A:
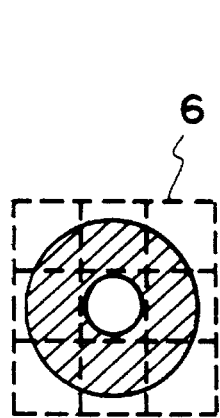
FIGS. 7A–7C are schematic views for explaining light intensity distributions on the light entrance surfaces of the optical integrators of FIG. 6.
Figure 7B:
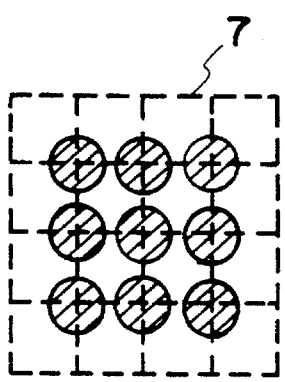
Figure 7C:
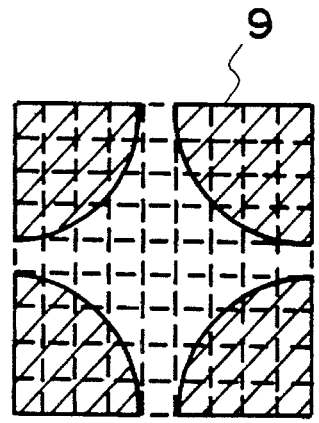

FIG. 6 is a schematic view for explaining the elements 6, 7, 8 and 9 in this case. In FIG. 6, while light source images are formed on the light entrance surface 7a of the second optical integrator 7 by means of the first optical integrator 6, these light source images are defocused such as depicted in FIG. 7B, as compared with the case of FIG. 5B. FIG. 7A shows the light intensity distribution on the light entrance surface 6a of the integrator 6, and this is the same as that of FIG. 5A. Also, on the light entrance surface 9a of the third optical integrator 9, the formed light intensity distribution has expanded quadruplex peaks as compared with the case of FIG. 5C.

In this manner, the spacing between the first and second optical integrators 6 and 7 along the optical axis may be changed from the FIG. 3 state, to adjust the light intensity distribution (effective light source) to be formed on the pupil plane 16a of the projection optical system 16.

Also, in this embodiment, in the high-resolution illumination state of FIG. 3 the disposition of the first condensing lens 8 may be changed (first condensing lens 8') and the imaging magnification of the light entrance surface of the small lenses 7i (i=1 to M) of the second optical integrator and the light entrance surface of the third optical integrator may be changed.

Figures 13A, 13B, 13C:
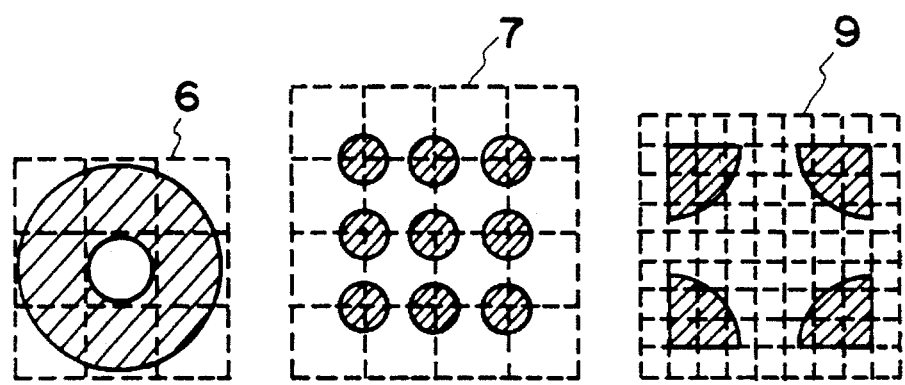
FIGS. 13A–13C are schematic views for explaining light intensity distributions on the light entrance surfaces of the optical integrators of FIG. 12.

FIG. 12 shows the elements 6, 7, 8' and 9 in such a case. FIG. 13A shows the light intensity distribution on the light entrance surface 6a of the first optical integrator 6, which is the same as that of FIG. 5B. The light intensity distribution to be formed in this case on the light entrance surface 9a of the third optical integrator 9 corresponds to that of FIG. 5C as magnification-changed (reduced), such as depicted in FIG. 13C.

Figure 14A:
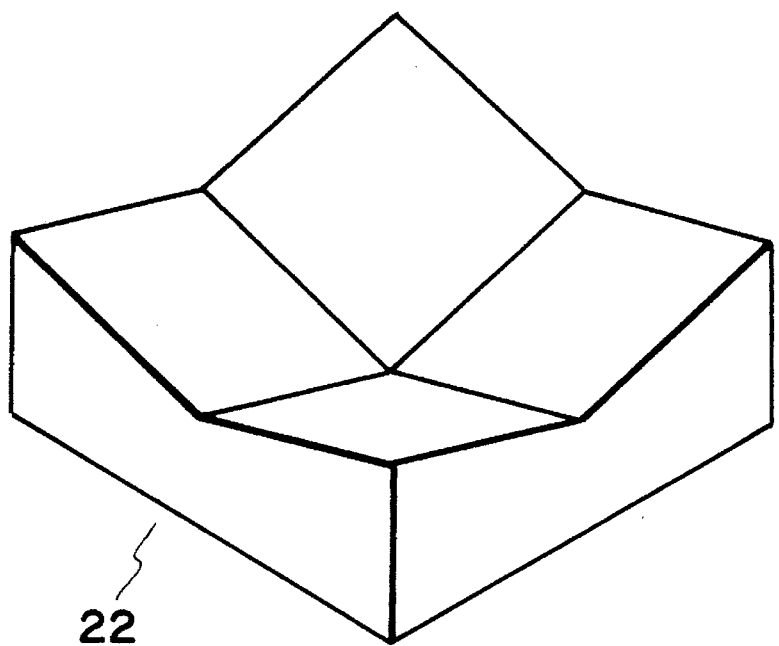
FIGS. 14A and 14B are schematic views prisms usable in the present invention.
Figure 14B:
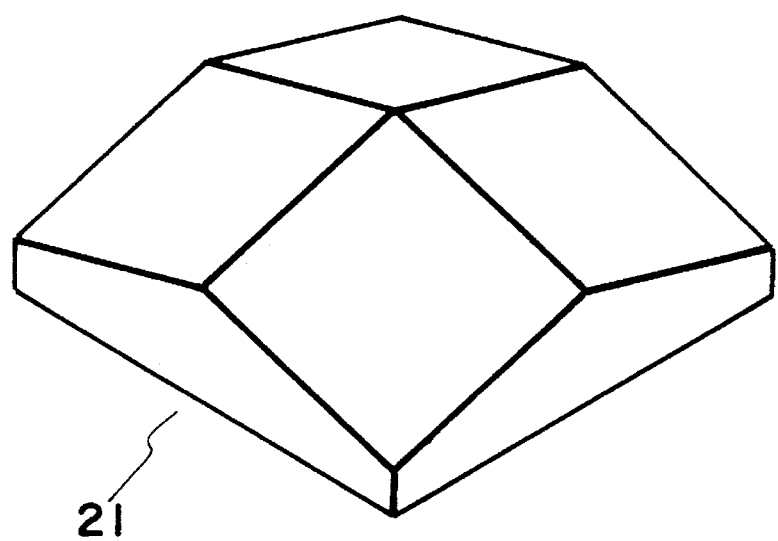
Figure 15A:
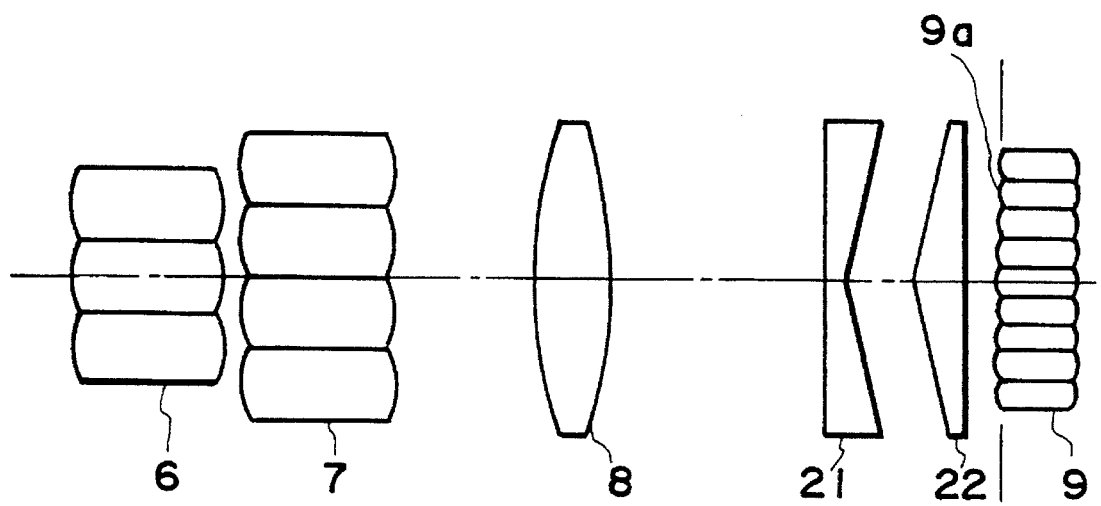
FIGS. 15A and 15B are schematic views for explaining a portion of a fourth embodiment of the present invention.
Figure 15B:
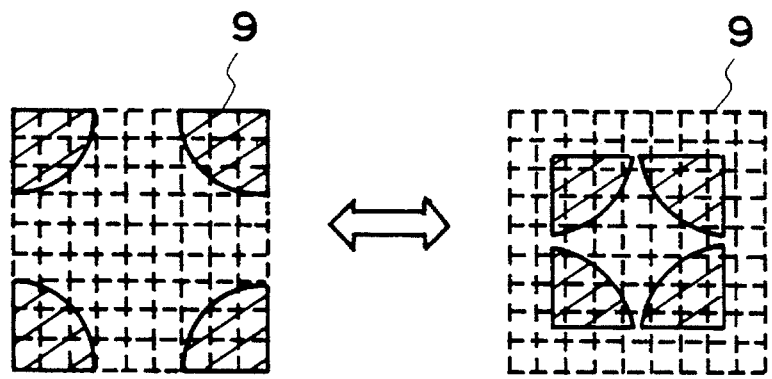

Further in this embodiment, in the high-resolution illumination state of FIG. 3, prisms 21 and 22 shown in FIG. 14 may be disposed in front of the third optical integrator 9 such as shown in FIG. 15A. On that occasion, by changing the spacing between the prisms 21 and 11, the light intensity distribution on the light entrance surface 9a of the third integrator 9 may be changed such as shown in FIG. 15B.

In this embodiment, in place of displacing the second optical integrator 7 in a direction perpendicular to the optical axis for establishing the high-resolution illumination, the first optical integrator 6 may be moved in a direction perpendicular to the optical axis. Further, the amount of displacement (eccentricity) is not limited to the half pitch of the small lenses of the first and second optical integrators. A desired amount of eccentricity may be adopted to adjust the effective light source distribution as desired. On that occasion, the effective light source distribution may be adjusted while monitoring it through the photodetector 12 of FIG. 1, for example.

FIGS. 10A–10C and FIGS. 11A–11C are schematic views for explaining the light intensity distribution on the light entrance surface of the optical integrators, in the normal illumination state and the high-resolution illumination state in a second embodiment of the present invention.

Basic structure of this embodiment is similar to the embodiment of FIG. 1 but, as a difference, the light source image 1b is imaged by the optical system 5 on the light entrance surface 6a of the first optical integrator 6.

FIGS. 10A, 10B and 10C show the light intensity distributions on the light entrance surfaces 6a, 7a and 9a of the first, second and third optical integrators 6, 7 and 9, respectively, in the normal illumination state (corresponding to the state of FIG. 1).

FIGS. 11A, 11B and 11C show the intensity distributions on the light entrance surfaces 6a, 7a and 9a of the first, second and third optical integrators 6, 7 and 9, respectively, in the high-resolution illumination state (corresponding to the state of FIG. 3) wherein the positional relationship between the small lenses of the first and second optical integrators 6 and 7 is changed.

While the invention has been described with reference to the structures disclosed herein, it is not confined to the details set forth and this application is intended to cover such modifications or changes as may come within the purposes of the improvements or the scope of the following claims.

What is claimed is:

1. An illumination device, comprising:

first and second optical integrators disposed along an optical axis and each having lens elements arrayed in a direction transverse to the optical axis;

an optical system for receiving light passed through said first and second optical integrators, and for forming a secondary light source; and means for relatively shifting said second optical integrator relative to said first optical integrator, in a direction transverse to the optical axis.

2. A device according to claim 1, wherein said lens elements of said first and second optical integrators are arrayed at the same pitch, and wherein said shifting means shifts said second optical integrator selectively between a first state in which said lens elements of said first and second optical integrators are placed coaxially and a second state in which said lens elements of said first and second optical integrators are relatively deviated by a half of said pitch.

3. A device according to claim 1 or 2, wherein said optical system includes prism means demountably insertable into a path of the light.

4. A device according to claim 1 or 2, wherein said optical system includes a variable-magnification optical system.

5. A device according to claim 1 or 2, wherein each of said lens elements of each of said first and second optical integrators has a square sectional shape.

6. A device according to claim 1 or 2, wherein said shifting means includes means for relatively shifting said second optical integrator relative to said first optical integrator along the optical axis.

7. An illumination device, comprising:

light source means;

first, second and third optical integrators disposed along an optical axis, for receiving light from said light source means, each of said first to third optical integrators having lens elements arrayed in a direction transverse to the optical axis;

a first optical system for directing, onto said third optical integrator, light passed through said first and second optical integrators, to form a secondary light source of said third optical integrator;

a second optical system for directing light from said secondary light source to a surface to be illuminated; and means for relatively shifting said second optical integrator relative to said first optical integrator, in a direction transverse to the optical axis.

8. A device according to claim 7, wherein said lens elements of said first and second optical integrators are arrayed at the same pitch, and wherein said shifting means shifts said second optical integrator selectively between a first state in which said lens elements of said first and second optical integrators are placed coaxially and a second state in which said lens elements of said first and second optical integrators are relatively deviated by a half of said pitch.

9. A device according to claim 8, wherein said first optical system includes prism means demountably insertable into a path of the light.

10. A device according to claim 8, wherein said first optical system includes a variable-magnification optical system.

11. A device according to claim 8, wherein each of said lens elements of each of said first, and second optical integrators has a square sectional shape.

12. A device according to claim 8, wherein said shifting means includes means for relatively shifting said second optical integrator relative to said first optical integrator along the optical axis.

13. A device according to claim 8, wherein said light source means includes a light emitting portion, an elliptical mirror for collecting light from said light emitting portion, and an imaging lens system for directing light collectively reflected by said elliptical mirror to said first optical integrator, and wherein said imaging lens system serves to image said light emitting portion on said first optical integrator.

14. A device according to claim 8, wherein said light source means includes a light emitting portion, an elliptical mirror with an opening, for collecting light from said light emitting portion, and an imaging lens system for directing light collectively reflected by said elliptical mirror to said first optical integrator, and wherein said imaging lens system serves to image said opening of said elliptical mirror on said first optical integrator.

15. A device according to claim 8, further comprising a stop disposed adjacent to a light exit surface of said third optical integrator, for adjusting the shape of said secondary light source.

16. An exposure apparatus for exposing a substrate to a mask, comprising:

first and second optical integrators disposed along an optical axis and each having lens elements arrayed in a direction transverse to the optical axis;

an optical system for receiving light passed through said first and second optical integrators, and for forming a secondary light source for illumination of the mask; and means for relatively shifting said second optical integrator relative to said first optical integrator, in a direction transverse to the optical axis.

17. An apparatus according to claim 16, wherein said lens elements of said first and second optical integrators are arrayed at the same pitch, and wherein said shifting means shifts said second optical integrator selectively between a first state in which said lens elements of said first and second optical integrators are placed coaxially and a second state in which said lens elements of said first and second optical integrators are relatively deviated by a half of said pitch.

18. An apparatus according to claim 16 or 17, wherein said optical system includes prism means demountably insertable into a path of the light.

19. An apparatus according to claim 16 or 17, wherein said optical system includes a variable-magnification optical system.

20. An apparatus according to claim 16 or 17, wherein each of said lens elements of each of said first and second optical integrators has a square sectional shape.

21. An apparatus according to claim 16 or 17, wherein said shifting means includes means for relatively shifting said second optical integrator relative to said first optical integrator along the optical axis.

22. An illumination device, comprising:

first and second optical integrators disposed along an optical axis and each having lens elements arrayed in a direction transverse to the optical axis, said lens elements of said first and second optical integrators having a relative eccentricity in their optical axes; and an optical system for receiving light passed through said first and second optical integrators, and for forming a secondary light source.

23. A device according to claim 22, wherein said lens elements of said first and second optical integrators are arrayed at the same pitch, and wherein said lens elements of said first and second optical integrators are relatively deviated by a half of said pitch.

24. A device according to claim 22, wherein said optical system includes prism means demountably insertable into a path of the light.

25. A device according to claim 22, wherein said optical system includes a variable-magnification optical system.

26. A device according to claim 22, wherein each of said lens elements of each of said first and second optical integrators has a square sectional shape.

27. An illumination device, comprising:

light source means;

first, second and third optical integrators disposed along an optical axis, for receiving light from said light source means, each of said first to third optical integrators having lens elements arrayed in a direction transverse to the optical axis, said lens elements of said first and second optical integrators having relative eccentricity in their optical axes;

a first optical system for directing, onto said third optical integrator, light passed through said first and second optical integrators, to form a secondary light source through said third optical integrator; and a second optical system for directing light from said secondary light source to a surface to be illuminated.

28. A device according to claim 27, wherein said lens elements of said first and second optical integrators are arrayed at the same pitch, and wherein the optical axes of said lens elements of said first, second and third optical integrators are relatively deviated by a half of said pitch.

29. A device according to claim 28, wherein said first optical system includes prism means demountably insertable into a path of the light.

30. A device according to claim 28, wherein said first optical system includes a variable-magnification optical system.

31. A device according to claim 28, wherein each of said lens elements of each of said first and second optical integrators has a square sectional shape.

32. A device according to claim 28, wherein said light source means includes a light emitting portion, an elliptical mirror for collecting light from said light emitting portion, and an imaging lens system for directing light collectively reflected by said elliptical mirror to said first optical integrator, and wherein said imaging lens system serves to image said light emitting portion on said first optical integrator.

33. A device according to claim 28, wherein said light source means includes a light emitting portion, an elliptical mirror with an opening, for collecting light from said light emitting portion, and an imaging lens system for directing light collectively reflected by said elliptical mirror to said first optical integrator, and wherein said imaging lens system serves to image said opening of said elliptical mirror on said first optical integrator.

34. A device according to claim 28, further comprising a stop disposed adjacent to a light exit surface of said third optical integrator, for adjusting the shape of said secondary light source.

35. An exposure apparatus for exposing a substrate to a mask, comprising:

first and second optical integrators disposed along an optical axis and each having lens elements arrayed in a direction transverse to the optical axis, said lens elements of said first and second optical integrators having a relative eccentricity in their optical axes; and an optical system for receiving light passed through said first and second optical integrators, and for forming a secondary light source.

36. An apparatus according to claim 35, wherein said lens elements of said first and second optical integrators are arrayed at the same pitch, and wherein said lens elements of said first and second optical integrators are relatively deviated by a half of said pitch.

37. An apparatus according to claim 36, wherein said optical system includes prism means demountably insertable into a path of the light.

38. An apparatus according to claim 36, wherein said optical system includes a variable-magnification optical system.

39. An apparatus according to claim 36, wherein each of said lens elements of each of said first and second optical integrators has a square sectional shape.

40. An exposure apparatus for exposing a substrate to a mask, comprising:

light source means;

first, second and third optical integrators disposed along an optical axis, for receiving light from said light source means, each of said first to third optical integrators having lens elements arrayed in a direction transverse to the optical axis, said lens elements of said first and second optical integrators having relative eccentricity in their optical axes;

a first optical system for directing, onto said third optical integrator, light passed through said first and second optical integrators, to form a secondary light source through said third optical integrator;

a second optical system for directing light from said secondary light source to a surface to be illuminated; and a projection optical system for projecting an image of a pattern of the mask, irradiated with said secondary light source, to the substrate.

41. An apparatus according to claim 40, wherein said lens elements of said first and second optical integrators are arrayed at the same pitch, and wherein the optical axes of said lens elements of said first, second and third optical integrators are relatively deviated by a half of said pitch.

42. An apparatus according to claim 40, wherein said condensing optical system includes prism means demountably insertable into a path of the light.

43. An apparatus according to claim 40, wherein said condensing optical system includes a variable-magnification optical system.

44. An apparatus according to claim 40, wherein each of said lens elements of each of said first and second optical integrators has a square sectional shape.

45. A device according to claim 1, wherein a light entrance surface of said first optical integrator is optically conjugate with a light exit surface of said second optical integrator.

46. A device according to claim 7, wherein a light entrance surface of said first optical integrator is optically conjugate with a light exit surface of said second optical integrator, and wherein a light entrance surface of 47. A device according to claim 22, wherein a light entrance surface of said first optical integrator is optically conjugate with a light exit surface of said second optical integrator.

48. A device according to claim 27, wherein a light entrance surface of said first optical integrator is optically conjugate with a light exit surface of said second optical integrator, and wherein a light entrance of said second optical integrator is optically conjugate with a light entrance surface of said third optical integrator.

49. An apparatus according to claim 35, wherein a light entrance surface of said first optical integrator is optically conjugate with a light exit surface of said second optical integrator.

50. An apparatus according to claim 40, wherein a light entrance surface of said first optical integrator is optically conjugate with a light exit surface of said second optical integrator, and a light entrance surface of said second optical integrator is optically conjugate with a light entrance surface of said third optical integrator.

* * * * *

UNITED STATES PATENT AND TRADEMARK OFFICE
CERTIFICATE OF CORRECTION

PATENT NO. : 5,459,547
DATED : October 17, 1995
INVENTOR(S) : Takahisa SHIOZAWA

It is certified that error appears in the above-indentified patent and that said Letters Patent is hereby corrected as shown below:

COLUMN 1:

Line 18, "1-megabil" should read --1 megabit--.

COLUMN 2:

Line 35, "view" should read --views--.

Line 64, "views prisms" should read --views of prisms--

COLUMN 3:

Line 31, "lenses ７１" should read --lenses 7i--.

COLUMN 5:

Line 32, "integrator 6" should read --integrator 7--.

Line 46, "(i-1 to N)" should read --(i = 1 to N)--.

UNITED STATES PATENT AND TRADEMARK OFFICE
CERTIFICATE OF CORRECTION

PATENT NO. : 5,459,547
DATED : October 17, 1995
INVENTOR(S) : Takahisa SHIOZAWA

It is certified that error appears in the above-indentified patent and that said Letters Patent is hereby corrected as shown below:

COLUMN 8:

Line 38, "first," should read --first--.

COLUMN 12:

Line 6, "of" should read --of said second optical integrator is optically conjugate with a light entrance surface of said third optical integrator.--

Signed and Sealed this

Sixteenth Day of April, 1996

Attest:

BRUCE LEHMAN

Attesting Officer

Commissioner of Patents and Trademarks